United States Patent
Edwards

(10) Patent No.: US 8,264,055 B2
(45) Date of Patent: Sep. 11, 2012

(54) CMOS THERMOELECTRIC REFRIGERATOR

(75) Inventor: Henry Litzmann Edwards, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 537 days.

(21) Appl. No.: 12/538,571

(22) Filed: Aug. 10, 2009

(65) Prior Publication Data

US 2010/0032748 A1 Feb. 11, 2010

Related U.S. Application Data

(60) Provisional application No. 61/087,220, filed on Aug. 8, 2008.

(51) Int. Cl.
*H01L 23/34* (2006.01)
(52) U.S. Cl. ............... 257/469; 257/713; 257/E23.082; 438/54
(58) Field of Classification Search .......... 257/467, 257/469, 470, 712, 713, E23.082; 438/54
See application file for complete search history.

(56) References Cited

U.S. PATENT DOCUMENTS

| | | | | |
|---|---|---|---|---|
| 5,895,964 A * | 4/1999 | Nakayama | ..................... | 257/577 |
| 6,588,217 B2 * | 7/2003 | Ghoshal | ........................... | 62/3.7 |
| 6,774,450 B2 * | 8/2004 | Inbe | ............................. | 257/467 |
| 7,541,644 B2 * | 6/2009 | Hirano et al. | ................. | 257/347 |
| 2006/0102223 A1 * | 5/2006 | Chen et al. | ..................... | 136/201 |

* cited by examiner

*Primary Examiner* — Matthew W Such
*Assistant Examiner* — Scott Stowe
(74) *Attorney, Agent, or Firm* — Jacqueline J. Garner; Wade J. Brady, III; Frederick J. Telecky, Jr.

(57) ABSTRACT

A CMOS thermoelectric refrigerator made of an NMOS transistor and PMOS transistor connected in series through a cold terminal is disclosed. Active areas of the NMOS and PMOS transistors are less than 300 nanometers wide, to reduce thermal conduction between the cold terminal and the IC substrate. Drain nodes of the NMOS and PMOS transistors are connected through hot terminals to a biasing circuit. The drain node of the NMOS transistor is biased positive with respect to the drain node of the PMOS transistor, to extract hot electrons and hot holes from the cold terminal. Biases on the drain nodes and gates of the NMOS and PMOS transistors may be adjusted to optimize the efficiency of the CMOS thermoelectric refrigerator or maximize the thermal power of the CMOS thermoelectric refrigerator. The cold terminal may be configured to cool a selected component in the IC, such as a transistor.

19 Claims, 4 Drawing Sheets

CMOS THERMOELECTRIC REFRIGERATOR

FIELD OF THE INVENTION

This invention relates to the field of integrated circuits. More particularly, this invention relates to devices to locally cool selected components in integrated circuits.

BACKGROUND OF THE INVENTION

It is well known that integrated circuits (ICs) frequently generate heat during operation so as to raise temperatures of internal components such as transistors above 90 C. Some component performance parameters such as noise and off-state current degrade significantly when the component temperatures rise above ambient. It is generally desired to cool some components in ICs, but cooling mechanisms and methods which use ambient air, such as fans mounted on IC packages, provide limited cooling of key components. Thermoelectric coolers mounted on IC packages consume too much power to be useful in many applications, and often fail to provide sufficient cooling of key components.

Accordingly, a device which provides local cooling of selected components in an IC is desired.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The need for a device to provide local cooling of selected components in an integrated circuit (IC) is addressed by the instant invention, which provides a complementary metal oxide semiconductor (CMOS) thermoelectric refrigerator including an n-channel metal oxide semiconductor (NMOS) transistor and a p-channel metal oxide (PMOS) transistor connected in series through a cold terminal. Active areas of the NMOS and PMOS transistors are less than 300 nanometers wide, to reduce thermal conduction between the cold terminal and the substrate of the IC. Gate lengths of the NMOS and PMOS transistors are preferably less than 30 nanometers to reduce heat transfer to the transistor bodies. Drain nodes of the NMOS and PMOS transistors are connected to hot terminals. The source and drain regions of the NMOS and PMOS transistors in the CMOS thermoelectric refrigerator may be fabricated concurrently with other NMOS and PMOS transistors in the IC. The cold terminal may be configured to cool a selected component in the IC, such as a transistor.

DETAILED DESCRIPTION

Figure 1:
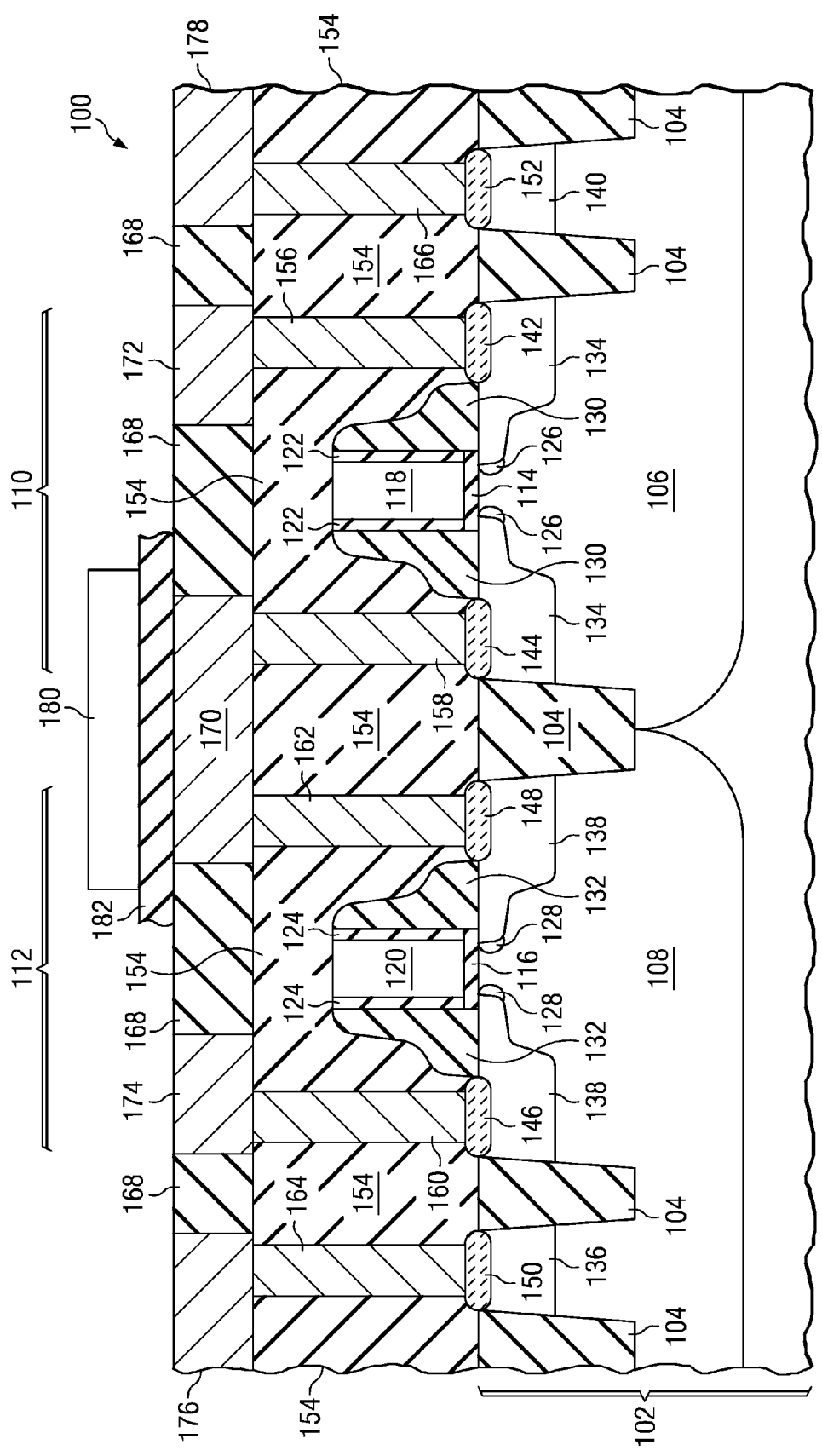
FIG. 1 is a cross-section of an IC containing an embodiment of the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The need for a device to provide local cooling of selected components in an integrated circuit (IC) is addressed by the instant invention, which provides a complementary metal oxide semiconductor (CMOS) thermoelectric refrigerator in which source nodes of an n-channel metal oxide semiconductor (NMOS) transistor and a p-channel metal oxide (PMOS) transistor are connected to a cold terminal. Active areas of the NMOS and PMOS transistors are less than 300 nanometers wide, so as to desirably reduce thermal conduction of heat between the cold terminal and a substrate of the IC. Drain nodes of the NMOS and PMOS transistors are connected to hot terminals. The drain node of the NMOS transistor is biased positive with respect to the drain node of the PMOS transistor, to extract hot electrons and hot holes from the cold terminal. Biases on the drain nodes and gates of the NMOS and PMOS transistors may be adjusted to optimize an efficiency of the CMOS thermoelectric refrigerator or maximize a thermal power transfer rate of the CMOS thermoelectric refrigerator. The cold terminal may be configured to cool a selected component in the IC, such as a transistor.

FIG. 1 is a cross-section of an IC containing an embodiment of the instant invention. The IC 100 is formed in a substrate 102, typically single crystal silicon, but possibly with regions of silicon-germanium (Si—Ge) in a top region of the substrate 102. The substrate 102 may also be a wafer with an epitaxial layer, a silicon-on-insulator (SOI) wafer, a hybrid orientation technology (HOT) wafer containing regions of different crystal orientations, or any other structure capable of supporting fabrication of the IC 100. Elements of field oxide 104 are formed by a shallow trench isolation (STI) process sequence, in which trenches, commonly 200 to 500 nanometers deep, are etched into the substrate 102, electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as the high aspect ratio process (HARP). A p-type well 106, commonly called a p-well, is formed in the substrate 102, typically by ion implanting a p-well set of p-type dopants, including boron and possibly gallium and/or indium, at doses from $1 \cdot 10^{11}$ to $1 \cdot 10^{14}$ atoms/cm$^2$, into an area defined for the p-well 106. A p-well photoresist pattern, not shown in FIG. 1 for clarity, is commonly used to block the p-well set of p-type dopants from areas outside the p-well area. The p-well 106 extends from a top surface of the substrate 102 to a depth typically 50 to 500 nanometers below a bottom surface of the field oxide elements 104. The ion implantation process to form the p-well 106 may include additional steps to implant additional p-type dopants at shallower depths for purposes of improving n-channel metal oxide semiconductor (NMOS) transistor performance, such as threshold adjustment, leakage current reduction and suppression of parasitic bipolar operation. An n-type well 108, commonly called an n-well, is formed in the substrate 102, typically by ion implanting an n-well set of n-type dopants, including phosphorus and arsenic, and possibly antimony, at doses from $1 \cdot 10^{11}$ to $1 \cdot 10^{14}$ atoms/cm$^2$, into a region defined for the n-well 108. An n-well photoresist pattern, not shown in FIG. 1 for clarity, is commonly used to block the n-well set of n-type dopants from areas outside the n-well area. The n-well 108 extends from the top surface of the substrate 102 to a depth typically 50 to 500 nanometers below the bottom surface of the field oxide elements 104. The ion implantation process to form the n-well 108 may include additional steps to implant additional n-type dopants at shallower depths for purposes of improving p-channel metal oxide semiconductor (PMOS) transistor performance, such as threshold adjustment, A NMOS transistor 110 is formed in the p-well 106 and a PMOS transistor 112 is formed in the n-well 108, by a fabrication process sequence including the following steps. The NMOS transistor 110 and PMOS transistor 112 are less than 300 nanometers wide, in a direction perpendicular to the plane of FIG. 1, to reduce vertical thermal conduction. An NMOS gate dielectric layer 114, typically silicon dioxide, nitrogen doped silicon dioxide, silicon oxy-nitride, hafnium oxide, layers of silicon dioxide and silicon nitride, or other insulating material, is formed on a top surface of the p-well 106. A PMOS gate dielectric layer 116, typically including most or all the same materials as the NMOS gate dielectric layer 114, is formed on a top surface of the n-well 108. It is common to form a portion or all of the PMOS gate dielectric layer 116 concurrently with the NMOS gate dielectric layer 114. An NMOS gate 118 is formed on a top surface of the NMOS gate dielectric layer 114, typically by depositing a layer of polycrystalline silicon, commonly known as polysilicon, on the top surface of the NMOS gate dielectric layer 114, defining an NMOS gate area with an NMOS gate photoresist pattern, not shown in FIG. 1 for clarity, and removing unwanted polysilicon using known etching methods. Similarly, a PMOS gate 120 is formed on a top surface of the PMOS gate dielectric layer 116, commonly concurrently with the NMOS gate 118. NMOS offset spacers 122 are formed on lateral surfaces of the NMOS gate 118, typically by oxidizing the lateral surfaces of the NMOS gate. PMOS offset spacers 124 are formed on lateral surfaces of the PMOS gate 120, typically by oxidizing the lateral surfaces of the PMOS gate 120 followed by depositing a conformal layer of silicon nitride and/or silicon dioxide on the PMOS gate 120 and performing an anisotropic etch to remove conformal layer material from a top surface of the PMOS gate 120. It is uncommon for the NMOS offset spacers 122 and the PMOS offset spacers 124 to have a same thickness or material profile.

N-type lightly doped drain (NLDD) regions are formed in the top region of the p-well 106 adjacent to the NMOS offset spacers 122, typically by ion implanting an NLDD set of n-type dopants, including phosphorus and arsenic, and possibly antimony, at a total dose between $3 \cdot 10^{14}$ and $3 \cdot 10^{15}$ atoms/cm$^2$, into areas defined for the NLDD regions. An NLDD photoresist pattern, not shown in FIG. 1 for clarity, is commonly used to block the NLDD set of n-type dopants from areas outside the NLDD regions. The NLDD region typically extends from the top surface of the p-well 106 to a depth between 10 and 50 nanometers.

While the NLDD photoresist pattern is in place, p-type NMOS halo regions 126 are formed in the top region of the p-well 106 under the NMOS offset spacers 122 and laterally abutting the NLDD regions, typically by ion implanting an NMOS halo set of p-type dopants, including boron, commonly in the form BF$_2$, and possibly gallium or indium, at a total dose between $1 \cdot 10^{13}$ and $1 \cdot 10^{14}$ atoms/cm$^2$. in two or four sub-doses at an angle of 10 to 30 degrees rotated about a vertical axis to provide a uniform concentration of p-type dopants on all sides of the NMOS gate 118.

It is common to perform an NLDD anneal operation which heats the IC 100 to activate a portion of the n-type dopants in the NLDD regions and a portion of the p-type dopants in the NMOS halo regions.

P-type lightly doped drain (PLDD) regions are formed in the top region of the n-well 108 adjacent to the PMOS offset spacers 124, typically by ion implanting a PLDD set of p-type dopants, including boron, commonly in the form BF$_2$, and possibly gallium or indium, at a total dose between $1 \cdot 10^{14}$ and $1 \cdot 10^{15}$ atoms/cm$^2$, into areas defined for the PLDD regions. A PLDD photoresist pattern, not shown in FIG. 1 for clarity, is commonly used to block the PLDD set of p-type dopants from areas outside the PLDD regions. The PLDD region typically extends from the top surface of the n-well 108 to a depth between 10 and 50 nanometers.

While the PLDD photoresist pattern is in place, n-type PMOS halo regions 128 are formed in the top region of the n-well 108 under the PMOS offset spacers 124 and laterally abutting the PLDD regions, typically by ion implanting a PMOS halo set of n-type dopants, including phosphorus, and possibly arsenic and/or antimony, at a total dose between $1 \cdot 10^{13}$ and $1 \cdot 10^{14}$ atoms/cm$^2$, in two or four sub-doses at an angle of 10 to 30 degrees rotated about a vertical axis to provide a uniform concentration of p-type dopants on all sides of the PMOS gate 120.

It is common to perform a PLDD anneal operation which heats the IC 100 to activate a portion of the p-type dopants in the PLDD regions and a portion of the n-type dopants in the PMOS halo regions.

NMOS gate sidewall spacers 130 are formed on lateral surfaces of the NMOS gate 118, typically by deposition of one or more conformal layers of silicon nitride and/or silicon dioxide on a top and lateral surfaces of the NMOS gate 118 and the top surface of the p-well 106, followed by removal of the conformal layer material from the top surface of the NMOS gate 118 and the top surface of the p-well 106 by known anisotropic etching methods, leaving the conformal layer material on the lateral surfaces of the NMOS gate 118. Similarly, PMOS gate sidewall spacers 132 are formed on lateral surfaces of the PMOS gate 120, typically concurrently with the NMOS gate sidewall spacers 130.

N-type source drain (NSD) regions 134 are formed in the top region of the p-well 106 adjacent to the NMOS gate sidewall spacers 130, typically by ion implanting an NSD set of n-type dopants, including phosphorus and arsenic, and possibly antimony, at a total dose between $3 \cdot 10^{14}$ and $1 \cdot 10^{16}$ atoms/cm$^2$ into NSD implanted regions which are continuous with the NLDD regions. An NSD photoresist pattern, not shown in FIG. 1 for clarity, is commonly used to block the NSD set of n-type dopants from areas outside the NSD implanted regions. An NSD anneal operation activates a portion of the n-type dopants in the NSD implanted regions to form NSD regions 134 which include the NLDD regions. The NSD regions 134 typically extend from the top surface of the p-well 106 to a depth between 100 and 500 nanometers.

An n-type diffused region to provide a low resistance electrical connection to the n-well 108, commonly known as an n-type tap region 136, is formed in a top region of the n-well, typically concurrently with the NSD regions 134.

P-type source drain (PSD) regions 138 are formed in the top region of the n-well 108 adjacent to the PMOS gate sidewall spacers 132, typically by ion implanting a PSD set of p-type dopants, including boron, sometimes partly in the form $BF_2$, and possibly indium and/or gallium, at a total dose between $5 \cdot 10^{14}$ and $1 \cdot 10^{16}$ atoms/cm$^2$ into PSD implanted regions which are continuous with the PLDD regions. A PSD photoresist pattern, not shown in FIG. 1 for clarity, is commonly used to block the PSD set of p-type dopants from areas outside the PSD implanted regions. A PSD anneal operation activates a portion of the p-type dopants in the PSD implanted regions to form PSD regions 138 which include the PLDD regions. The PSD regions 138 typically extend from the top surface of the n-well 108 to a depth between 100 and 500 nanometers.

A p-type diffused region to provide a low resistance electrical connection to the p-well 106, commonly known as a p-type tap region 140, is formed in a top region of the p-well, typically concurrently with the PSD regions 138.

It is common to combine the NSD anneal operation with the PSD anneal operation.

Metal silicide is formed on top surfaces of the NSD and PSD regions 134, 138 and the n-type tap and p-type tap regions 136, 140, typically by depositing a layer of metal, for example nickel, on a top surface of the IC 100, heating the IC 100 to react the metal with silicon in the NSD and PSD regions 134, 138 and the n-type tap and p-type tap regions 136, 140 to form metal silicide, for example nickel silicide, an selectively removing unreacted metal from the IC 100, commonly by using wet etchants including hydrogen peroxide. The IC 100 is commonly heated again to covert the metal silicide into a more desirable chemical phase, resulting in an NMOS drain silicide layer 142, an NMOS source silicide layer 144, a PMOS drain silicide layer 146, a PMOS source silicide layer 148, an n-type tap silicide layer 150 and a p-type tap silicide layer 152.

A pre-metal dielectric (PMD) layer 154, typically a dielectric layer stack including a silicon nitride or silicon dioxide PMD liner 10 to 100 nanometers thick deposited by plasma enhanced chemical vapor deposition (PECVD), a layer of silicon dioxide, phospho-silicate glass (PSG) or boro-phospho-silicate glass (BPSG), commonly 100 to 1000 nanometers thick deposited by PECVD, commonly leveled by a chemical-mechanical polish (CMP) process, and an optional PMD cap layer, commonly 10 to 100 nanometers of a hard material such as silicon nitride, silicon carbide nitride or silicon carbide, is formed on a top surface of the IC 100.

An NMOS drain contact 156, an NMOS source contact 158, a PMOS drain contact 160, a PMOS source contact 162, an n-well tap contact 164 and a p-well tap contact 166 are formed in the PMD layer 154 to make electrical connections to the NMOS drain silicide layer 142, the NMOS source silicide layer 144, the PMOS drain silicide layer 146, the PMOS source silicide layer 148, the n-type tap silicide layer 150 and the p-type tap silicide layer 152, respectively. Contacts 156, 159, 160, 162, 164, 166 are formed by defining contact areas on a top surface of the PMD 154 with a contact photoresist pattern, not shown in FIG. 1 for clarity, etching contact holes in the contact areas by removing PMD layer material using known etching methods to expose the silicide layers 142, 144, 146, 148, 150, 152, and filling the contact holes with a contact liner metal, such as titanium, and a contact fill metal, typically tungsten, followed by removal of the contact fill metal from the top surface of the PMD layer 154 using known etching and/or CMP methods. An NMOS gate contact, not shown in FIG. 1 for clarity, which makes an electrical connection to the NMOS gate 118 and a PMOS gate contact, also not shown in FIG. 1 for clarity, which makes an electrical connection to the PMOS gate 120, are formed concurrently with the depicted contacts 156, 159, 160, 162, 164, 166.

An intra-metal dielectric (IMD) layer 168, typically organo-silicate glass (OSG), carbon-doped silicon oxides (SiCO or CDO) or methylsilsesquioxane (MSQ) between 50 and 200 nanometers thick, is formed on a top surface of the PMD layer 154.

Metal interconnect elements, including a cold terminal 170, an NMOS hot terminal interconnect element 172, a PMOS hot terminal interconnect element 174, an n-well tap interconnect element 176 and a p-well tap interconnect element 178, are formed of copper in the IMD layer 168 using known methods, including defining areas for the metal interconnect elements with a metal interconnect photoresist pattern on a top surface of the IMD layer 168, etching interconnect trenches in the IMD layer using known etching methods to expose top surfaces of the contacts 156, 159, 160, 162, 164, 166, filling the trenches with an interconnect liner metal such as tantalum nitride and an interconnect fill metal, typically copper, and removing excess metal from the top surface of the IMD layer 168 using known copper CMP methods. The cold terminal 170 is electrically connected to the NMOS source contact 158 and PMOS source contact 162. The NMOS hot terminal interconnect element 172 electrically connects the NMOS drain contact 156 to a CMOS thermoelectric refrigerator bias circuit, not shown in FIG. 1 for clarity, in the IC 100. The PMOS hot terminal interconnect element 174 electrically connects the PMOS drain contact 160 to the CMOS thermoelectric refrigerator bias circuit. The n-well tap interconnect element 176 electrically connects the n-well tap contact 164 to an n-well bias circuit, not shown in FIG. 1 for clarity. The p-well tap interconnect element 178 electrically connects the p-well tap contact 166 to a p-well bias circuit, also not shown in FIG. 1 for clarity. An NMOS gate interconnect element, not shown in FIG. 1 for clarity, electrically connects the NMOS gate contact to the CMOS thermoelectric refrigerator bias circuit. A PMOS gate interconnect element, also not shown in FIG. 1 for clarity, electrically connects the PMOS gate contact to the CMOS thermoelectric refrigerator bias circuit.

A component 180, such as an MOS transistor, a bipolar transistor, a polysilicon resistor, junction field effect transistor (JFET) or other component in the IC 100, may be formed proximate to the cold terminal 170, and thermally coupled to the cold terminal 170 by a thermally conducting electrically insulating interposer 182. In one realization of the instant embodiment, the interposer 182 may be a layer of dielectric material such as silicon dioxide, formed as part of an interconnect region of the IC 100.

During operation of the CMOS thermoelectric refrigerator described in reference to FIG. 1, a p-well bias equal to a ground potential is applied to the p-well tap interconnect element 178, an n-well bias preferably between 1.0 and 1.5 volts is applied to the n-well tap interconnect element 176, an NMOS drain bias preferably between the n-well bias and an average of the p-well bias and the n-well bias is applied to the NMOS hot terminal interconnect element 172, a PMOS drain bias between the p-well bias and an average of the p-well bias and the n-well bias is applied to the PMOS hot terminal interconnect element 174. An NMOS gate bias preferably between the n-well bias and a threshold potential of the NMOS transistor 110 is applied to the NMOS gate interconnect element, and a PMOS gate bias preferably between the p-well bias and a threshold potential of the PMOS transistor 112 is applied to the PMOS gate interconnect element. These biases result in an n-type inversion layer under the NMOS gate dielectric layer 114 and a p-type inversion layer under the PMOS gate dielectric layer 116, and an electrical current from the NMOS hot terminal interconnect element 172 through the NMOS transistor 110, through the cold terminal 170, through the PMOS transistor 112 and out the PMOS hot terminal interconnect element 174. Energetic electrons in the cold terminal 170 are extracted through the NMOS transistor into the NMOS drain contact 156. Energetic holes in the cold terminal 170 are extracted through the PMOS transistor into the PMOS drain contact 160. The cold terminal 170 may be cooled by the extraction of electrons and holes described herein. The component 180 may advantageously be cooled by thermal conduction of heat from the component 180 through the interposer 182 to the cold terminal 170.

In a preferred embodiment, a gate length of the NMOS transistor 110 is less than 30 nanometers, to minimize scattering of electrons in the n-type inversion layer during their transit from the cold terminal 170 to the NMOS hot terminal interconnect element 172. Similarly, in a preferred embodiment, a gate length of the PMOS transistor 112 is less than 30 nanometers, to minimize scattering of holes in the p-type inversion layer during their transit from the cold terminal 170 to the PMOS hot terminal interconnect element 174.

In an alternate embodiment, the PSD regions 138 are formed of Si—Ge, which reduces thermal conduction between the cold terminal 170 and the n-well 108, and between the PMOS hot terminal interconnect element 174 and the n-well 108.

Figure 2A:
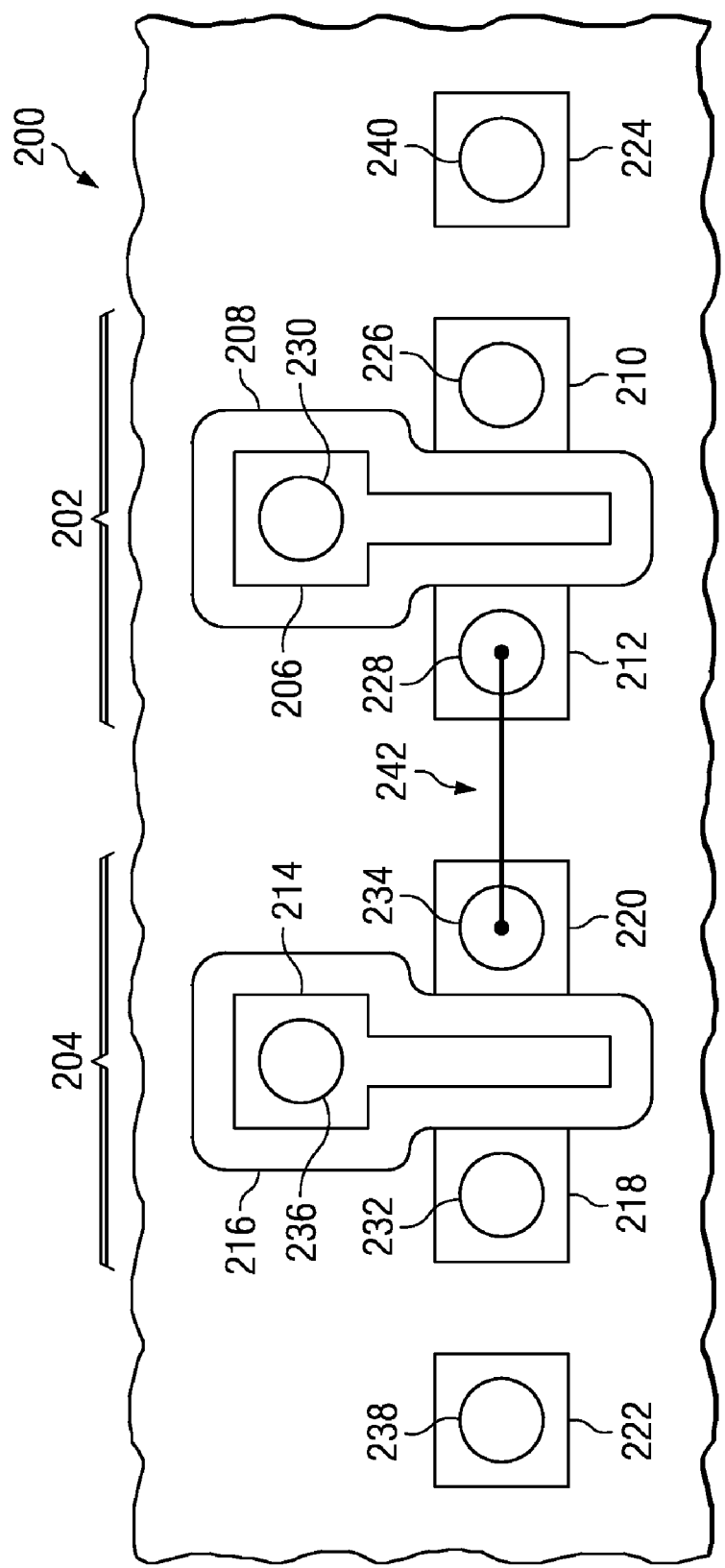
FIG. 2A and FIG. 2B are top views of ICs containing alternate embodiments of CMOS thermoelectric refrigerators formed according to the instant invention.
Figure 2B:
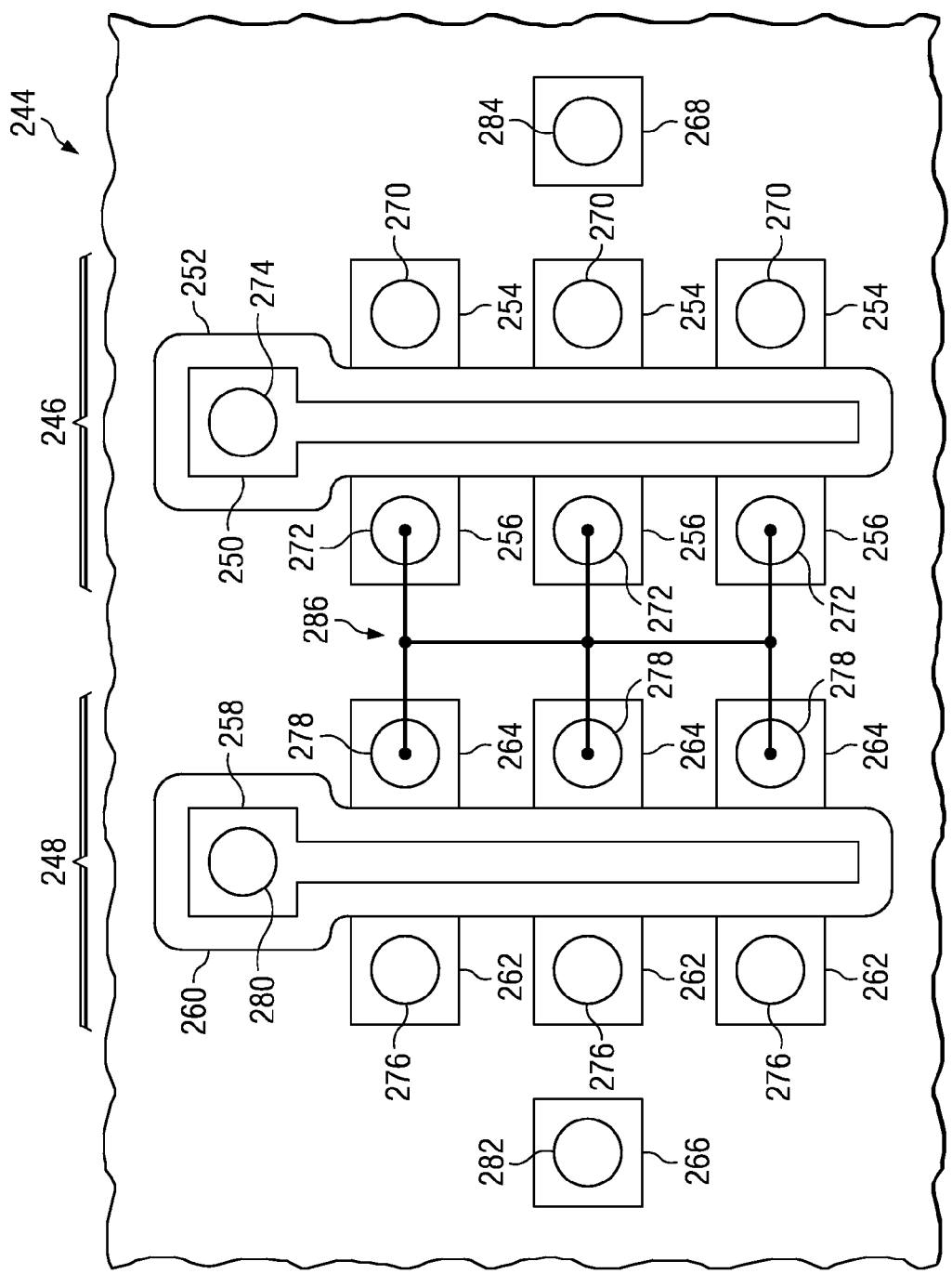

FIG. 2A and FIG. 2B are top views of ICs containing alternate embodiments of CMOS thermoelectric refrigerators formed according to the instant invention. Referring to FIG. 2A, a first IC 200 includes an NMOS transistor 202 and a PMOS transistor 204. The NMOS transistor 202 includes an NMOS gate 206, an NMOS gate sidewall spacer 208, an NMOS drain region 210, and an NMOS source region 212. The NMOS drain region 210 and NMOS source region 212 are less than 300 nanometers wide. The PMOS transistor 204 includes a PMOS gate 214, a PMOS gate sidewall spacer 216, a PMOS drain region 218, and a PMOS source region 220. The PMOS drain region 218 and PMOS source region 220 are less than 300 nanometers wide. The first IC 100 also includes an n-type tap region 222 adjacent to the PMOS transistor 204 and a p-type tap region 224 adjacent to the NMOS transistor 202.

Still referring to FIG. 2A, an NMOS drain contact 226 is electrically connected to the NMOS drain region 210, an NMOS source contact 228 is electrically connected to the NMOS source region 212, and an NMOS gate contact 230 is electrically connected to the NMOS gate 206. A PMOS drain contact 232 is electrically connected to the PMOS drain region 218, a PMOS source contact 234 is electrically connected to the PMOS source region 220, and a PMOS gate contact 236 is electrically connected to the PMOS gate 214. An n-well tap contact 238 is electrically connected to the n-type tap region 222, and a p-well tap contact 240 is electrically connected to the p-type tap region 224. A cold terminal is represented schematically by a cold terminal linkage 242.

Other arrangements of the elements of the CMOS thermoelectric refrigerator described in reference to FIG. 2A are within the scope of the instant invention.

FIG. 2B depicts an alternate embodiment of the instant invention which provides more cooling power. A second IC 244 includes a set of NMOS transistors 246 and a set of PMOS transistors 248. The NMOS transistors 246 include a common NMOS gate 250, an NMOS gate sidewall spacer 252, and separate NMOS drain regions 254 and NMOS source regions 256 for each NMOS transistor 246. The NMOS drain regions 254 and NMOS source regions 256 are each less than 300 nanometers wide. The PMOS transistors 248 include a common PMOS gate 258, a PMOS gate sidewall spacer 260, and separate PMOS drain regions 262 and PMOS source regions 264 for each PMOS transistor 248. The PMOS drain regions 262 and PMOS source regions 264 are each less than 300 nanometers wide. The second IC 244 also includes an n-type tap region 266 adjacent to the PMOS transistors 248 and a p-type tap region 268 adjacent to the NMOS transistors 246.

Continuing to refer to FIG. 2B, NMOS drain contacts 270 are electrically connected to the NMOS drain regions 254, NMOS source contacts 272 are electrically connected to the NMOS source regions 256, and an NMOS gate contact 274 is electrically connected to the NMOS gate 250. PMOS drain contacts 276 are electrically connected to the PMOS drain regions 262, PMOS source contacts 278 are electrically connected to the PMOS source regions 264, and a PMOS gate contact 280 is electrically connected to the PMOS gate 258. An n-well tap contact 282 is electrically connected to the n-type tap region 266, and a p-well tap contact 284 is electrically connected to the p-type tap region 268. A cold terminal is represented schematically by a cold terminal linkage 286.

The embodiment depicted in FIG. 2B is advantageous because it can provide more cooling power than embodiments with a single NMOS transistor and a single PMOS transistor.

The embodiment depicted in FIG. 2B is furthermore advantageous because the separate NMOS drain regions 254 and PMOS drain regions 262 may be individually biased to further increase the efficiency of the CMOS thermoelectric refrigerator.

Other arrangements of the elements of the CMOS thermoelectric refrigerator described in reference to FIG. 2B are within the scope of the instant invention.

Figure 3:
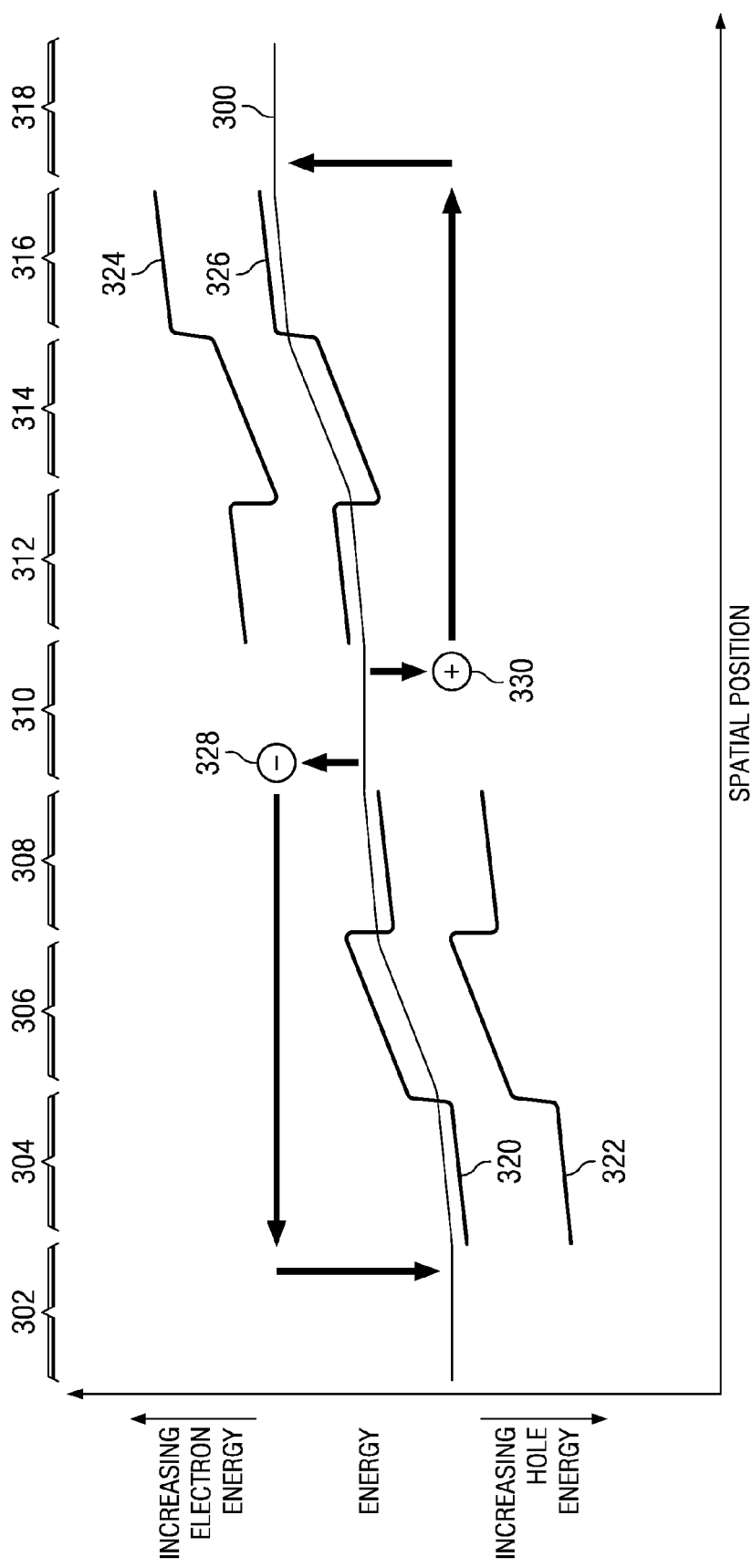
FIG. 3 is an energy band diagram of elements in a CMOS thermoelectric refrigerator formed according to an embodiment of the instant invention during operation as described in reference to FIG. 1.

FIG. 3 is an energy band diagram of elements in a CMOS thermoelectric refrigerator formed according to an embodiment of the instant invention during operation as described in reference to FIG. 1. A Fermi level 300 is plotted in an NMOS hot terminal interconnect element 302, an NMOS n-type drain region 304, an NMOS n-type inversion layer 306, an NMOS n-type source region 308, a cold terminal 310, a PMOS p-type source region 312, a PMOS p-type inversion layer 314, a PMOS p-type drain region 316, and a PMOS hot terminal interconnect element 318. An NMOS conduction band edge 320 and an NMOS valence band edge 322 are plotted in the NMOS n-type drain region 304, the NMOS n-type inversion layer 306 and the NMOS n-type source region 308. A PMOS conduction band edge 324 and a PMOS valence band edge 326 are plotted in the PMOS p-type source region 312, the PMOS p-type inversion layer 314 and the PMOS p-type drain region 316. An NMOS-side energy barrier for electrons exists between the NMOS Fermi level 300 in the cold terminal 310 and the conduction band edge 320 in the NMOS n-type inversion layer 306. Similarly, a PMOS-side energy barrier for holes exists between the Fermi level 300 in the cold terminal 310 and the PMOS valence band edge 326 in the PMOS p-type inversion layer 314. The NMOS conduction band edge 320 is at or below the Fermi level 300 in the NMOS n-type drain region 304 and the NMOS n-type source region 308 because these regions are degenerately doped. Similarly, the PMOS valence band edge 326 is at or below the Fermi level 300 in the PMOS p-channel source region 312 and PMOS p-channel drain region 316 because these regions are degenerately doped.

Still referring to FIG. 3, electrons 328 in the cold terminal 310 with sufficient kinetic energy to surmount the NMOS-side energy barrier may drift into the NMOS n-type inversion layer 306 under the influence of the applied biases. Once in the NMOS n-type inversion layer 306, electrons 328 drift to the NMOS hot terminal interconnect element 302. Optimizing the NMOS gate bias may cause the electrons 328 to transit to the NMOS hot terminal interconnect element 302 with a minimum of energy loss, thus minimizing heat transfer from the electrons 328 to the NMOS n-type source and drain regions 304, 308. Removal of electrons 328 with sufficient kinetic energy to surmount the NMOS-side energy barrier from the cold terminal 310 results in a net loss of total energy in the cold terminal 310. Similarly, holes 330 in the cold terminal 310 with sufficient kinetic energy to surmount the PMOS-side energy barrier may drift into the PMOS p-type inversion layer 314 under the influence of the applied biases. Once in the PMOS p-type inversion layer 314, holes 330 drift to the PMOS hot terminal interconnect element 318. Optimizing the PMOS gate bias may cause the holes 330 to transit to the PMOS hot terminal interconnect element 318 with a minimum of energy loss, thus minimizing heat transfer from the holes 330 to the PMOS p-type source and drain regions 312, 316. Removal of holes 330 with sufficient kinetic energy to surmount the PMOS-side energy barrier from the cold terminal 310 results in a net loss of total energy in the cold terminal 310.

Proper selection of the applied biases results in heat flow from the cold terminal 310 to the NMOS hot terminal interconnect element 302 and to the PMOS hot terminal interconnect element 318, so that the cold terminal metal interconnect element 310 is cooled. It is advantageous for the NMOS n-type drain region 304, NMOS n-type inversion layer 306 and NMOS n-type source region 308 to be less than 300 nanometers wide, because thermal conductivity between the cold terminal 310 and the IC substrate is reduced, thereby increasing an efficiency of the CMOS thermoelectric refrigerator. Similarly, it is advantageous for the PMOS p-type source region 312, PMOS p-type inversion layer 314 and PMOS p-type drain region 316 to be less than 300 nanometers wide, because thermal conductivity between the cold terminal 310 and the IC substrate is reduced, thereby further increasing the efficiency of the CMOS thermoelectric refrigerator. Vertical thermal conduction in the NMOS and PMOS source and drain regions and inversion layers 304, 306, 308, 312, 314, 316 decreases as their widths decrease, further increasing the efficiency.

In an alternate embodiment, the NMOS n-type source and drain regions 304, 308 may be formed with different ion implant processes than used to form the NSD region in other NMOS transistors in the IC, in order to improve a cooling efficiency of the CMOS thermoelectric refrigerator. Similarly, the PMOS p-type source and drain regions 312, 316 may be formed with different ion implant processes than used to form the PSD region in other PMOS transistors in the IC, in order to further improve a cooling efficiency of the CMOS thermoelectric refrigerator.

What is claimed is:

1. A complementary metal oxide semiconductor (CMOS) thermoelectric refrigerator, comprising: an n-channel metal oxide semiconductor (NMOS) transistor, in which: an NMOS drain region of said NMOS transistor is less than 300 nanometers wide; an NMOS source region of said NMOS transistor is less than 300 nanometers wide; said NMOS drain region is electrically connected to an NMOS hot terminal interconnect element of said CMOS thermoelectric refrigerator; and said NMOS source region is electrically connected to a cold terminal of said CMOS thermoelectric refrigerator; a p-channel metal oxide semiconductor (PMOS) transistor, in which: PMOS drain region of said PMOS transistor is less than 300 nanometers wide; a PMOS source region of said PMOS transistor is less than 300 nanometers wide; said PMOS drain region is electrically connected to a PMOS hot terminal interconnect element of said CMOS thermoelectric refrigerator; and said PMOS source region is electrically connected to said cold terminal; and a bias circuit connected to said NMOS hot terminal interconnect element and said PMOS hot terminal interconnect element, said bias circuit configured to bias the NMOS hot terminal interconnect element positive with respect to the PMOS hot terminal interconnect element to extract hot electrons and hot holes from the cold terminal.

2. The CMOS thermoelectric refrigerator of claim 1, in which:
   a gate length of said NMOS transistor is less than 30 nanometers; and
   a gate length of said PMOS transistor is less than 30 nanometers.

3. The CMOS thermoelectric refrigerator of claim 2, further comprising:
   a second NMOS transistor, in which:
      a second NMOS drain region of said second NMOS transistor is less than 300 nanometers wide;
      a second NMOS source region of said second NMOS transistor is less than 300 nanometers wide;
      said second NMOS source region is electrically connected to said cold terminal; and
      a gate length of said second NMOS transistor is less than 30 nanometers;
   and
   a second PMOS transistor, in which:
      a second PMOS drain region of said second PMOS transistor is less than 300 nanometers wide;
      a second PMOS source region of said second PMOS transistor is less than 300 nanometers wide;
      said second PMOS source region is electrically connected to said cold terminal; and
      a gate length of said second PMOS transistor is less than 30 nanometers.

4. The CMOS thermoelectric refrigerator of claim 2, in which:
   said PMOS drain region is comprised of silicon-germanium (Si—Ge); and
   said PMOS drain region is comprised of Si—Ge.

5. An integrated circuit, comprising: a CMOS thermoelectric refrigerator, further comprising: an NMOS transistor, in which: an NMOS drain region of said NMOS transistor is less than 300 nanometers wide; an NMOS source region of said NMOS transistor is less than 300 nanometers wide; said NMOS drain region is electrically connected to an NMOS hot terminal interconnect element of said CMOS thermoelectric refrigerator; and said NMOS source region is electrically connected to a cold terminal of said CMOS thermoelectric refrigerator; a PMOS transistor, in which: a PMOS drain region of said PMOS transistor is less than 300 nanometers wide; a PMOS source region of said PMOS transistor is less than 300 nanometers wide; said PMOS drain region is electrically connected to a PMOS hot terminal interconnect element of said CMOS thermoelectric refrigerator; and said PMOS source region is electrically connected to said cold terminal; and a bias circuit connected to said NMOS hot terminal interconnect element and said PMOS hot terminal interconnect element, said bias circuit configured to bias the NMOS hot terminal interconnect element positive with respect to the PMOS hot terminal interconnect element to extract hot electrons and hot holes from the cold terminal; and a transistor thermally connected to said cold terminal.

6. The integrated circuit of claim 5, in which:
a gate length of said NMOS transistor is less than 30 nanometers; and
a gate length of said PMOS transistor is less than 30 nanometers.

7. The integrated circuit of claim 6, in which said CMOS thermoelectric refrigerator further comprises:
a second NMOS transistor, in which:
a second NMOS drain region of said second NMOS transistor is less than 300 nanometers wide;
a second NMOS source region of said second NMOS transistor is less than 300 nanometers wide;
said second NMOS source region is electrically connected to said cold terminal; and
a gate length of said second NMOS transistor is less than 30 nanometers;
and
a second PMOS transistor, in which:
a second PMOS drain region of said second PMOS transistor is less than 300 nanometers wide;
a second PMOS source region of said second PMOS transistor is less than 300 nanometers wide;
said second PMOS source region is electrically connected to said cold terminal; and
a gate length of said second PMOS transistor is less than 30 nanometers.

8. The integrated circuit of claim 6, in which:
said PMOS drain region is comprised of Si—Ge; and
said PMOS drain region is comprised of Si—Ge.

9. The integrated circuit of claim 6, in which said transistor is a metal oxide semiconductor (MOS) transistor.

10. The integrated circuit of claim 6, in which said transistor is a bipolar transistor.

11. The integrated circuit of claim 6, in which said transistor is a junction field effect transistor.

12. A method of forming an integrated circuit, comprising the steps of: forming a CMOS thermoelectric refrigerator, further comprising the steps of: forming an NMOS transistor, further comprising the steps of: forming an NMOS drain region of said NMOS transistor such that said NMOS drain region is less than 300 nanometers wide; forming an NMOS source region of said NMOS transistor such that said NMOS source region is less than 300 nanometers wide; forming an electrical connection between said NMOS drain region and an NMOS hot terminal interconnect element of said CMOS thermoelectric refrigerator; and forming an electrical connection between said NMOS source region and a cold terminal of said CMOS thermoelectric refrigerator; forming a PMOS transistor, further comprising the steps of: forming a PMOS drain region of said PMOS transistor such that said PMOS drain region is less than 300 nanometers wide; forming a PMOS source region of said PMOS transistor such that said PMOS source region is less than 300 nanometers wide; forming an electrical connection between said PMOS drain region and a PMOS hot terminal interconnect element of said CMOS thermoelectric refrigerator; and forming an electrical connection between said PMOS source region and said cold terminal; and forming a bias circuit connected to said NMOS hot terminal interconnect element and said PMOS hot terminal interconnect element, said bias circuit configured to bias the NMOS hot terminal interconnect element positive with respect to the PMOS hot terminal interconnect element to extract hot electrons and hot holes from the cold terminal; and forming a thermal connection between a transistor and said cold terminal.

13. The method of claim 12, in which:
said step of forming said NMOS transistor further comprises the step of forming an NMOS gate of said NMOS transistor with a gate length less than 30 nanometers; and
said step of forming said PMOS transistor further comprises the step of forming a PMOS gate of said PMOS transistor with a gate length less than 30 nanometers.

14. The method of claim 13, in which said step of forming said CMOS thermoelectric refrigerator further comprises the steps of:
forming a second NMOS transistor, further comprising the steps of:
forming a second NMOS drain region of said second NMOS transistor such that said second NMOS drain region is less than 300 nanometers wide;
forming a second NMOS source region of said second NMOS transistor such that said second NMOS source region is less than 300 nanometers wide; and
forming an electrical connection between said second NMOS source region and said cold terminal;
and
forming a second PMOS transistor, further comprising the steps of:
forming a second PMOS drain region of said second PMOS transistor such that said second PMOS drain region is less than 300 nanometers wide;
forming a second PMOS source region of said second PMOS transistor such that said second PMOS source region is less than 300 nanometers wide;
forming an electrical connection between said second PMOS source region and said cold terminal.

15. The method of claim 13, in which:
said PMOS drain region is comprised of Si—Ge; and
said PMOS drain region is comprised of Si—Ge.

16. The method of claim 13, in which said transistor is a metal oxide semiconductor (MOS) transistor.

17. The method of claim 13, in which said transistor is a bipolar transistor.

18. The method of claim 13, in which said transistor is a junction field effect transistor.

19. The method of claim 13, in which:
said step of forming said NMOS drain region is performed concurrently with forming n-type source/drain (NSD) regions in a second NMOS transistor in said integrated circuit;
said step of forming said NMOS source region is performed concurrently with forming said NSD regions in said second NMOS transistor;
said step of forming said PMOS drain region is performed concurrently with forming p-type source/drain (PSD) regions in a second PMOS transistor in said integrated circuit; and
said step of forming said PMOS source region is performed concurrently with forming said PSD regions in said second PMOS transistor.

* * * * *